(12) United States Patent
Yang

(10) Patent No.: US 11,515,345 B2
(45) Date of Patent: Nov. 29, 2022

(54) IMAGE SENSOR

(71) Applicant: SK hynix Inc., Icheon-si (KR)

(72) Inventor: Yun Hui Yang, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 144 days.

(21) Appl. No.: 16/842,072

(22) Filed: Apr. 7, 2020

(65) Prior Publication Data

US 2021/0066361 A1 Mar. 4, 2021

(51) Int. Cl.
*H01L 27/146* (2006.01)

(52) U.S. Cl.
CPC .... *H01L 27/14607* (2013.01); *H01L 27/1463* (2013.01); *H01L 27/14621* (2013.01)

(58) Field of Classification Search
None
See application file for complete search history.

(56) References Cited

U.S. PATENT DOCUMENTS

| | | | |
|---|---|---|---|
| 11,391,994 B2* | 7/2022 | Dong | G02F 1/1339 |
| 2017/0047371 A1* | 2/2017 | Lee | H01L 27/14643 |
| 2017/0062496 A1* | 3/2017 | Lai | H01L 27/1464 |
| 2018/0053796 A1* | 2/2018 | Baek | H01L 27/1463 |
| 2019/0157329 A1* | 5/2019 | Kim | H01L 27/14621 |
| 2019/0288192 A1* | 9/2019 | Takahashi | H01L 45/149 |

FOREIGN PATENT DOCUMENTS

KR 10-2013-0033967 A 4/2013

* cited by examiner

*Primary Examiner* — Ali Naraghi
(74) *Attorney, Agent, or Firm* — Perkins Coie LLP

(57) ABSTRACT

Designs of image sensors by including at least one grid structure extending in rows and columns of a pixel array including a plurality of imaging pixels arranged in rows and columns and structured to separate the imaging pixels from one another, the grid structure including a low-index material or an air to provide optical isolation between two adjacent imaging pixels, and a plurality of holes respectively formed at crossing points of the grid structures.

21 Claims, 13 Drawing Sheets

IMAGE SENSOR

CROSS-REFERENCE TO RELATED APPLICATION

This patent document claims the priority and benefits of Korean patent application No. 10-2019-0108630, filed on Sep. 3, 2019, the disclosure of which is incorporated by reference in its entirety as part of the disclosure of this patent document.

TECHNICAL FIELD

The technology and implementations disclosed in this patent document generally relate to an image sensor including color filters arranged adjacent to each other.

BACKGROUND

An image sensor is a device that captures light from an optical image or one or more objects using photosensitive semiconductor elements and converts the captured color light into electrical signals. With the recent development of automotive, medical, computer, and communication industries, the demand for high-performance image sensors is increasing in various devices such as smartphones, digital cameras, game consoles, Internet of Things (IoT), robots, surveillance cameras, medical micro-cameras, etc.

One very common type of image sensing device is a charge coupled device (CCD), which has dominated the field of image sensors for a long time. Another common type of image sensing device is a complementary metal oxide semiconductor (CMOS) image sensing device. CCD image sensors have advantages over the CMOS image sensor in terms of noise characteristics and image quality. However, CMOS image sensors are now widely used due to certain advantages over the CCD counterparts, including, e.g., higher frame rates and shutter speed. In addition, CMOS image sensors and signal processing circuitry can be integrated into a single chip, making it possible to miniaturize electronic devices while achieving lower power consumption. In addition, using the CMOS fabrication technology can result reduction in the production costs. Such characteristics of CMOS image sensors make these sensors better suited for implementations in mobile devices.

SUMMARY

The embodiments of the disclosed technology, among other features and benefits, relate to an image sensor that can reduce optical interference between pixels.

Some embodiments of the disclosed technology relate to an image sensor that includes an air grid structure that can maintain its stability of the air grid in a situation where air pressure in the air grid structure increases.

In an embodiment of the disclosed technology, an image sensor may include at least one grid structure extending in rows and columns of a pixel array including a plurality of imaging pixels arranged in rows and columns and structured to separate the imaging pixels from one another, the grid structure including a low-index material or an air to provide optical isolation between two adjacent imaging pixels, and a plurality of holes respectively formed at crossing points of the grid structures.

In another embodiment of the disclosed technology, an image sensor may include a plurality of (2×2) matrix arrays of unit pixels, a plurality of holes arranged at centers of the plurality of (2×2) matrix arrays of unit pixels, respectively, and a grid structure extending in a direction from the plurality of holes, respectively, along one side of each of the unit pixels.

In another embodiment of the disclosed technology, an image sensor may include at least one air grid formed to extend either in a row direction or in a column direction of a pixel array, and a hole arranged at a crossing point of the air grid extending in the row direction and the air grid extending in the column direction.

The image sensor may further include a color filter disposed between the air grids disposed at sides facing each other in a unit pixel contained in the pixel array.

The hole may be formed in a manner that an air layer is omitted from the air grid.

The hole may be arranged at a center part of plural pixels arranged in a (2×2) matrix shape.

The hole may be formed in a circular shape.

The air grid may include an air layer filled with air, and a first capping film formed to surround the air layer.

A refractive index of the first capping film may be higher than a refractive index of the air layer, and may be lower than a refractive index of a color filter contacting the air grid.

The air grid may further include a second capping film formed to surround the first capping film, and formed to have a larger thickness than the first capping film.

The air grid may further include a metal layer formed of metal while being arranged below the air layer.

A lower portion of the hole may include a stacked structure of a first capping film and a second capping film that are respectively integrated with a first capping film of the air grid surrounding the hole and a second capping film of the air grid surrounding the hole.

The image sensor may further include a metal layer formed of metal while being interposed between the first capping film of the lower portion of the hole and a substrate.

The metal may be tungsten (W).

In another embodiment of the disclosed technology, an image sensor may include a hole arranged at a center part of plural unit pixels arranged in a (2×2) matrix shape, and an air grid formed to extend in a direction from the hole to one side of each of the unit pixels.

DETAILED DESCRIPTION

Figure 1:
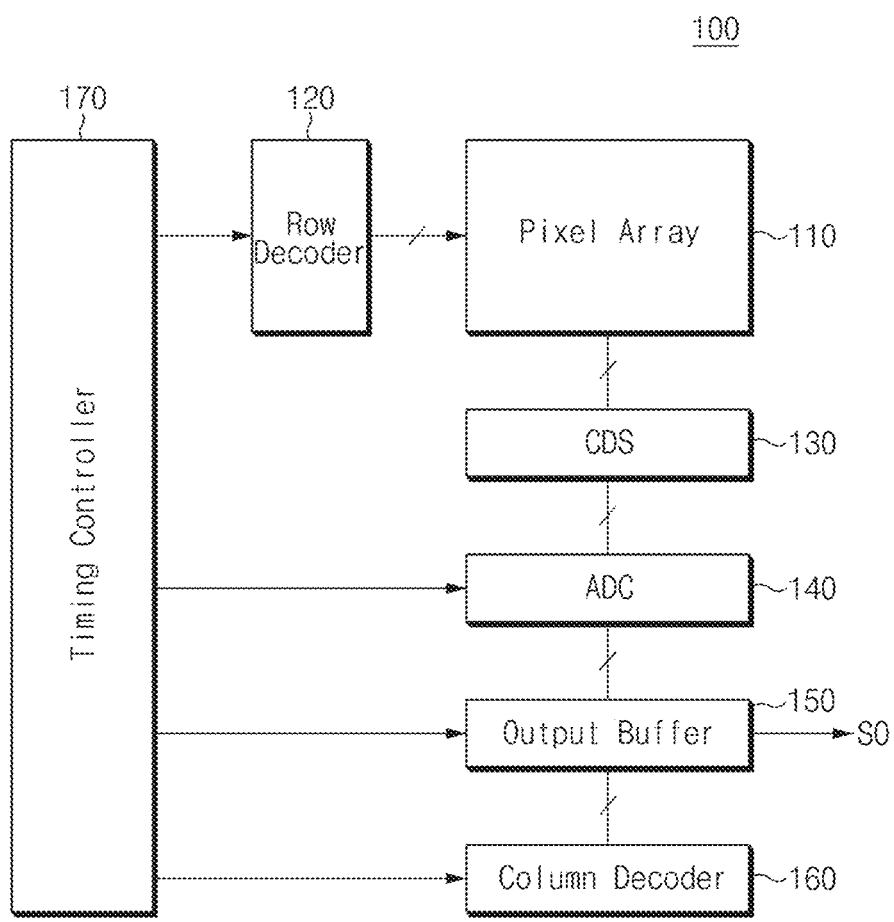
FIG. 1 is a block diagram illustrating an image sensor based on some embodiments of the disclosed technology.

FIG. 1 is a block diagram illustrating an image sensor 100 based on an embodiment of the disclosed technology.

In some implementations, the image sensor 100 may include a pixel array 110, a row decoder 120, a correlated double sampling (CDS) circuit 130, an analog-to-digital converter (ADC) 140, an output buffer 150, a column decoder 160, and a timing controller 170.

The pixel array 110 may include a plurality of unit pixels arranged in a two-dimensional (2D) array. In an implementation, the plurality of unit pixels may be arranged such that each unit pixel has its own dedicated driver circuits. In another implementation, the pixel array 110 may have a shared pixel structure where at least two unit pixels share at least one common driver circuit such that element in converting an optical image (or incident light) into an electrical signal. The pixel array 110 may receive operating signals including a row selection signal, a pixel reset signal, and a transmission (Tx) signal, from the row decoder 120, and may be operated by the drive signal received from the row decoder 120.

The row decoder 120 may be used to select desired rows of the pixel array 110 based on control signals generated by the timing controller 170, In some implementations, in selecting rows from the pixel array 110, the row decoder 120 may generate a row selection signal to select at least one of a plurality of rows. The row decoder 120 may sequentially enable a pixel reset signal for resetting pixels corresponding to at least one selected row, and a transmission (Tx) signal for the selected pixels to transmit electrical signals generated by the pixels. In this way, an analog-type reference signal and an image signal that are generated from each pixel of the selected row may be sequentially transmitted to the CDS circuit 130. In this regard, the reference signal and the image signal may be collectively called a pixel signal.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the CDS circuit 130 may sequentially sample and hold the reference signal and the image signal that are transferred from the pixel array 110 to each of the plurality of column lines. That is, the CDS circuit 130 may sample and hold voltage levels of the reference signal and the image signal corresponding to each column of the pixel array 110.

The CDS circuit 130 may transmit a correlated double sampling (CDS) signal corresponding to the reference signal and the image signal for each column to the ADC 140 upon receiving a control signal from the timing controller 170.

The ADC block is used to convert analog CDS signals to digital signals. Examples of the ADC 140 may include a ramp-compare type ADC where the analog pixel signal is compared with a reference signal such as a ramp signal that ramps up or down and a timer counts until a voltage of the ramp signal matches the analog pixel signal. In some embodiments of the disclosed technology, the ADC 140 may receive the CDS signal for each column from the CDS circuit 130, may convert the received CDS signal into a digital signal, and may thus output the digital signal. In some implementations, the ADC 400 samples an input signal (e.g., pixel signal) multiple times using the reference signal and analog-to-digital convert the sampled input signals by counting the number of clock pulses until crossing points. The ADC 140 may perform such counting and calculation operations based on the CDS signal for each column and a ramp signal received from the timing controller 170, such that the ADC 140 may generate digital image data from which noise (e.g., unique reset noise for each pixel) corresponding to each column is removed.

The ADC 140 may include a plurality of column counters corresponding to respective columns of the pixel array 110, and may convert the CDS signal for each column into a digital signal using the column counters, resulting in formation of image data. In another embodiment, the ADC 140 may include a single global counter, and may convert a CDS signal corresponding to each column into a digital signal using a global code received from the global counter.

The output buffer 150 may be used to receive image data for each column received from the ADC 140. The output buffer 150 may capture the received image data and output the captured image data. The output buffer 150 may temporarily store image data that is output from the ADC 140 upon receiving a control signal from the timing controller 170. The output buffer 150 may operate as an interface configured to compensate for data rate difference or transmission (Tx) speed difference between the image sensor 100 and another device coupled to the image sensor 100.

The column decoder 160 may be used to select a column of the output buffer 150 upon receiving a control signal from the timing controller 170, and such that the image data temporarily stored in the selected column of the output buffer 150 are sequentially outputted. In some implementations, the column decoder 160 may receive an address signal from the timing controller 170, may generate a column selection signal based on the received address signal, and may select a column of the output buffer 150 to output image data as an output signal SO from the selected column of the output buffer 150 as an output signal SO.

The timing controller 170 may control the row decoder 120, the ADC 140, the output buffer 150, and the column decoder 160.

The timing controller 170 may transmit a clock signal for operating or synchronizing the constituent elements of the image sensor 100, a control signal for timing control, and address signals for selection of a row or column to the row decoder 120, the column decoder 160, the ADC 140, and the output buffer 150. In some embodiments of the disclosed technology, the timing controller 170 may include a logic control circuit, a phase locked loop (PLL) circuit, a timing control circuit, a communication interface circuit, etc.

Figure 2:
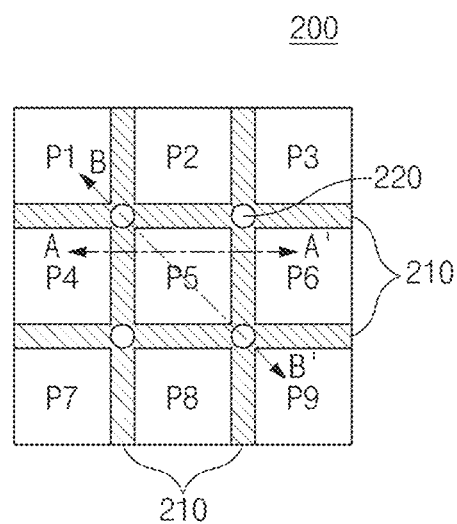
FIG. 2 is a schematic diagram illustrating one example of some parts of a pixel array shown in FIG. 1 based on some embodiments of the disclosed technology.

FIG. 2 is a schematic diagram illustrating an example of one portion 200 of the pixel array 110 shown in FIG. 1 based on some embodiments of the disclosed technology.

Referring to FIG. 2, a sub-pixel array 200 of the pixel array 110 may include 9 unit pixels P1-P9 arranged in a (3×3) matrix. Although FIG. 2 shows the sub-pixel array as having only 9 unit pixels P1-P9, each sub-pixel array can be implemented to have more than 9 unit pixels, and the pixel array 110 may include unit pixels arranged in a matrix shape composed of M rows (where 'M' is an arbitrary positive integer) and N columns (where 'N' is an arbitrary positive integer).

Between the unit pixels P1-P9, a low index separation grid with a central region of a low index material is provided to optically isolate or separate the unit pixels and may be implemented as an air grid structure that is filled with air in the central region of the grid so that that different unit pixels are optically isolated from neighboring unit pixels. In some embodiments of the disclosed technology, the grid structure may be an air grid 210 that includes an air layer in the structure.

The air grid 210 may be arranged not only between contiguous pixels (e.g., P1 and P2, P2 and P3, etc.) arranged in a row direction (or in a horizontal direction) of the pixel array 110, but also between contiguous pixels (e.g., P1 and P4, P4 and P7, etc.) arranged in a column direction (or in a vertical direction) of the pixel array 110. In addition, the air grid 210 may be arranged in the row direction and the column direction of the pixel array 110. The air grid 210 may be formed to extend along one side of each unit pixel contacting the air grid 210. In one example, the air grid 210 may be included in vertically or horizontally contiguous pixels. In another example, the air grid 210 may be a separate structure that is used to distinguish the vertically or horizontally contiguous pixels from each other.

In some embodiments of the disclosed technology, a hole 220 may be arranged to locate near or at the center, or in the central region of a 2×2 matrix of four adjacent unit pixels (e.g., P1, P2, P4, and P5). In the illustrated example of 9 adjacent unit pixels P1 through P9 in a 3×3 matrix in FIG. 2, the holes 220 are located at four centers of four different 2×2 matrices formed by the 9 adjacent unit pixels P1 through P9. Specifically, the hole 220 may be located at the crossing point of one air grid 210 extending in the row direction of the pixel array 110 and the other air grid 210 extending in the column direction of the pixel array 110. As such, a plurality of holes 220 are arranged at the crossing points of the air grids 210 arranged in rows and columns but are away from any peripheral border of the array of unit pixels. In one example, each of the plurality of holes 220 is arranged at the center of (2×2) matrix of the unit pixels, and the air grid 210 may extend along one side of each of the unit pixels (e.g., P1, P2, P4, and P5) from the hole 220.

The hole 220 may be formed by forming a void at the cross point of the air grids where each air grid includes a central region filled with a low index material or an air layers (e.g., 240 of FIG. 3A) except for the location where the hole 220 is to be placed.

The hole 220 may be formed to have a specific diameter needed to optimize characteristics of the air grid 210. For example, the hole 220 may be formed to have as large a diameter as possible under a specific condition in which the shape of the air grid 210 can be stably maintained.

Although FIG. 2 illustrates the hole 220 as having a circular shape by way of example, it should be noted that the shape of the hole 220, when viewed from above, may have any polygonal shapes such as a square or octagonal shape.

A color filter (e.g., a red color filter, a green color filter, a blue color filter, a yellow color filter, etc.) of the corresponding unit pixel may be disposed between the air grids 210 arranged along boundaries between adjacent unit pixels. In one example, the air grid 210 may be arranged to surround a peripheral region of each color filter of the arbitrary unit pixel.

A microlens, which is used to improve the sensitivity of photodetector photodiode) of the unit pixel by converging incident light onto the photodetector, may be disposed over the color filter. A substrate that includes such photodiodes may be disposed below the color filter.

In most cases, incident light having passed through the microlens and the color filter will propagate toward the corresponding photodiode. In some cases, however, incident light having passed through the microlens and the color filter of a specific pixel may propagate toward another pixel through neighboring color filters, resulting in unwanted crosstalk between pixels, which can cause noise in a pixel signal. The air grid 210 may be used to prevent such an optical crosstalk by absorbing light by the air grid or reflecting light toward a desired photodiode.

FIGS. 3A to 4B show cross-sectional structures of the air grid 210 and the hole 220 taken along a first cutting line A-A' and a second cutting line B-B' shown in FIG. 2. FIGS. 5A to 5G show fabrication processes for forming the air grid 210 and the hole 220.

Figure 3A:
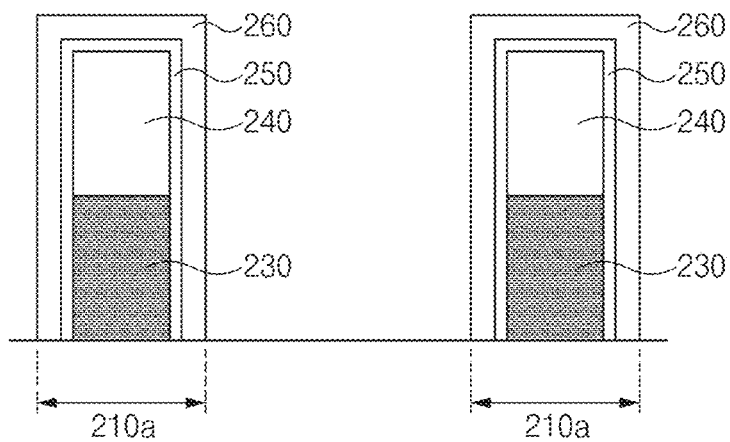
FIG. 3A is a cross-sectional view illustrating a portion of a pixel array taken along a first cutting line shown in FIG. 2 based on some embodiments of the disclosed technology.

FIG. 3A is a cross-sectional view illustrating one example of the pixel array taken along the first cutting line A-A' shown in FIG. 2 based on some embodiments of the disclosed technology.

In some implementations, two air grids 210a may be spaced apart from each other by a certain distance corresponding to a width of the pixel P5. The color filter of the pixel P5 may be disposed between the two air grids 210a. In an implementation, a top surface of the color filter may be located higher than a top surface of the air grid 210a. In another implementation, the top surface of the color filter may be located lower than that of the air grid 210a. In yet another implementation, the top surface of the color filter may be located at the same level as that of the air grid 210a.

The air grid 210a may include a metal layer 230, an air layer 240, a first capping film 250, and a second capping film 260. It is to be noted that relatively widths, relative heights, and relative thicknesses of constituent elements of the air grid 210a are not limited to those of FIG. 3A, and may not represent actual dimensions.

The metal layer 230 may be disposed over the substrate. The metal layer 230 may be formed of a metal material (e.g., tungsten) having a high light absorption rate, or may also be formed by stacking different kinds of materials.

The air layer 240 may be disposed over the metal layer 230, and the shape of the air layer 240 may be defined by a first capping film 250. The air layer 240 may be filled with air having a relatively low refractive index (e.g., a refractive index of 1). In some implementations, the air layer 240 may represent any low index material, and thus the air layer 240 may be filled with any material having a relatively low refractive index.

The first capping film 250 may be formed to surround the air layer 240 and the metal layer 230. That is, the first capping film 250 may be formed to contact a side surface and a top surface of each of the air layer 240 and the metal layer 230. Thus, each of the air layer 240 and the metal layer 230 may be physically isolated from the outside by the first capping film 250. For example, the first capping film 250 may be an ultra low temperature oxide (ULTO) film such as a silicon oxide film ($SiO_2$).

The second capping film 260 may be formed to surround the first capping film 250. That is, one side surface of the second capping film 260 may be in contact with the first capping film 250, and the other side surface of the second capping film 260 may be in contact with the outside of the air grid 210a. Therefore, the first capping film 250 may be physically isolated from the outside by the second capping film 260. For example, the second capping film 260 may be formed of an insulation film that includes at least one of a silicon oxide nitride film ($Si_xO_yN_z$, where each of 'x', 'y', and 'z' is a natural number), a silicon oxide film ($Si_xO_y$, where each of 'x' and 'y' is a natural number), and a silicon nitride film ($Si_xN_y$, where each of 'x' and 'y' is a natural number).

The second capping film 260 may be larger in thickness than the first capping film 250. The reason why the second capping film 260 has a larger thickness than the first capping film 250 is that the first capping film 250 is formed as thin as possible in a manner that internal materials of the first capping film 250 can be effectively discharged outside during the plasma process, and the second capping film 250 is formed to a predetermined thickness through which the shape of the air grid 210a including the air layer 240 can be stably maintained.

In some embodiments of the disclosed technology, a support film for maintaining the shape of the air grid structure 210a may be formed at a region corresponding to a lower part of the first capping film 250 and at a region corresponding to an upper part of the air layer 240. The support film may be an insulation film having no light absorption characteristics.

In some embodiments of the disclosed technology, the first capping film 250 and the second capping film 260 may be formed of the same materials, such that the first capping film 250 and the second capping film 260 may also have the same refractive index.

In some embodiments of the disclosed technology, the refractive index of each of the first capping film 250 and the second capping film 260 may be higher than that of the air layer 240, and may be lower than that of the color filter.

The air grid 210a may block light that has passed the color filter (not shown) from traveling to another color filter (not shown), thereby minimizing optical crosstalk.

In some implementations, since the refractive index (e.g., 1) of the air layer 240 filled with low index material such as air is lower than the refractive index (e.g., 1.6-1.7) of the color filter (not shown) and the refractive index (e.g., 1.4) of each of the first capping film 250 and the second capping film 260, the air layer 240 may block light from passing through toward neighboring pixels.

Whether light is reflected at the boundary of the air layer 240 may depend on an incident angle of the light, and thus a portion of the light at a certain incident angle may not be reflected and instead refracted toward the inside of the air layer 240. Even in this case, however, the portion of the light is absorbed by the metal layer 230 and thus optical crosstalk may be prevented.

Figure 3B:
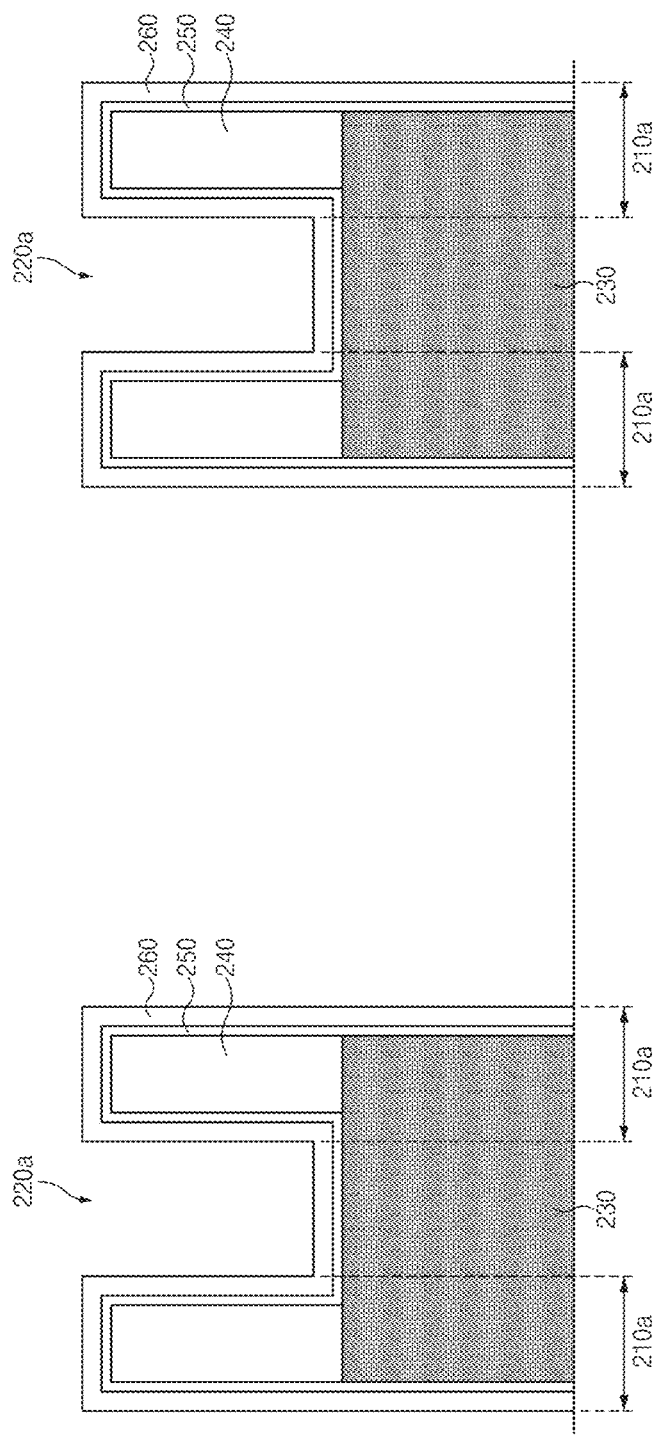
FIG. 3B is a cross-sectional view illustrating a portion of a pixel array taken along a second cutting line shown in FIG. 2 based on some embodiments of the disclosed technology.

FIG. 3B is a cross-sectional view illustrating one example of the pixel array taken along the second cutting line B-B' shown in FIG. 2 based on some embodiments of the disclosed technology.

Referring to FIG. 3B, the air grid 210a and the hole 220a may be formed over the cross-sectional view taken along the second cutting line B-B'.

The air grid 210a shown in FIG. 3B is identical or similar in structure to the air grid shown in FIG. 3A except for the hole 220a arranged at a region corresponding to the center of the air layers 240 of the air grids 210a contiguous to each other. A metal layer 230, a first capping film 250, and a second capping film 260 may be sequentially arranged in a lower portion of the hole 220a. In some implementations, the metal layer 230, the first capping film 250, and the second capping film 260 arranged in the lower portion of the hole 220a may be respectively integrated with the metal layer 230, the first capping film 250, and the second capping film 260 of each of the air grids 210a.

In another embodiment, the first capping film 250 and the second capping film 260 of each of the air grids 210a arranged to surround the hole 220a may be extended to a bottom surface of the metal layer 230. In other words, the metal layer 230 below the lower portion of the hole 220a may be omitted. In this case, an etch process may also be more simplified.

That is, the hole 220a may be formed in a manner that the air layer 240 is omitted from the air grid 210a, and the first capping film 250 and the second capping film 260 are sequentially stacked while being in contact with the metal layer 230, resulting in formation of the hole 220a.

Unlike the structure shown in FIG. 3B, it is assumed that the same structure as the air grid 210a is arranged in a region corresponding to the hole 220a such that the air layers 240 of the entire pixel array 110 are interconnected through a single region, forming a mesh-type structure.

In one example, since each of the first capping film 250 and the second capping film 260 is formed as a thin film, a vulnerable portion of the first and second capping films 250 and 260 that may exist due to limitations in fabrication processes and certain environments such as a high-temperature condition may cause collapse of the first and second capping films 250 and 260 when pressure is applied to the vulnerable portion. Such pressure applied to the vulnerable portion may increase in proportion to temperature and the volume of internal air of the air layer 240. In the case of using the mesh-type structure in which the air layers 240 of the entire pixel array 110 are interconnected through a single region, pressure corresponding to volume of the air layers 240 of the entire pixel array 110 is applied to the vulnerable portion, causing collapse of the pixel array.

However, since the grid structure based on some embodiments of the disclosed technology includes a plurality of holes 220a, each of which is arranged in each crossing point of the first air grid 210a extending in the row direction of the grid structure and the second air grid 210a extending in the column direction of the grid structure. Therefore, the air layers 240 of the air grids 210a that are respectively located at an upper part, a lower part, a left part, and a right part with respect to the position of each hole 220a can almost be physically isolated from one another. As a result, instead of applying pressure corresponding to volume of the air layers 240 of the entire pixel array 110 to the vulnerable point, pressure corresponding to volume of only one air layer 240 of the air grid 210a formed to extend along one side of the unit pixel may be applied to the vulnerable point in a manner that pressure to be applied to the vulnerable point can be dispersed and collapse (or popping) of the structure at the vulnerable point can be effectively prevented. That is, the pressure applied to a particular vulnerable point can be significantly reduced compared to the case of using the mesh-type structure in which the air layers 240 of the entire pixel array 110 are connected. In this case, the air layers 240 of the air grids 210a respectively located at the upper, lower, left, and right regions with respect to the position of each hole 220a are almost physically isolated from each other. In some embodiments of the disclosed technology, such holes 220a may reduce the size of a connection passage between the air layers 240 of the air grids 210a respectively arranged in the upper, lower, left, and right regions with respect to the position of each hole 220a, such that pressure does not propagate to other air layers.

Figure 4A:
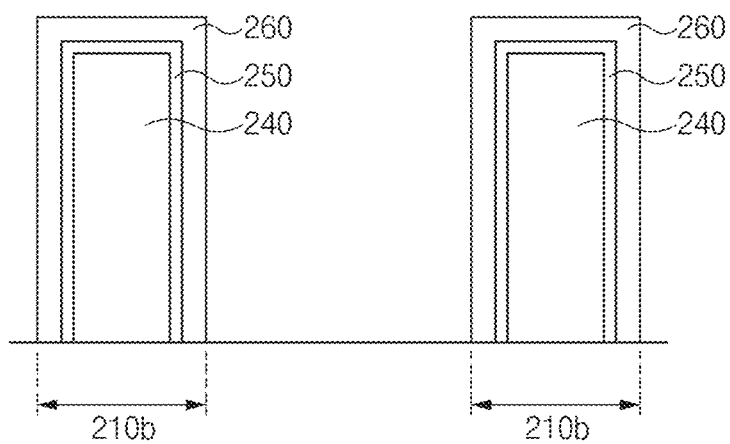
FIG. 4A is a cross-sectional view illustrating another example of the pixel array taken along the first cutting line shown in FIG. 2 based on some embodiments of the disclosed technology.

FIG. 4A is a cross-sectional view illustrating another example of the pixel array taken along the first cutting line A-A' shown in FIG. 2 based on some embodiments of the disclosed technology.

In some implementations, two air grids 210b may be spaced apart from each other by a certain distance corresponding to the width of the pixel P5. The color filter of the pixel P5 may be disposed between the two air grids 210b. In an implementation, a top surface of the color filter may be located higher than a top surface of the air grid 210b. In another implementation, the top surface of the color filter may be located lower than that of the air grid 210b. In yet another implementation, the top surface of the color filter may be located at the same level as that of the air grid 210b.

The air grid 210b may include an air layer 240, a first capping film 250, and a second capping film 260. It is to be noted that relatively widths, relative heights, and relative thicknesses of constituent elements contained in the air grid 210b are not limited to those of FIG. 4A, and may not represent actual dimensions.

The air grid 210b shown in FIG. 4A does not include the metal layer 230, unlike the air grid 210a shown in FIG. 3A. The air layer 240, the first capping film 250, and the second capping film 260 contained in the air grid 210b shown in FIG. 4A may be similar or identical in structure and material to those of the air grid shown in FIG. 3A.

In another embodiment, a support film for maintaining the shape of each air grid 210b may be formed in a region corresponding to a lower part of the first capping film 250 and a region corresponding to an upper part of the air layer 240. The support film may be an insulation film having no light absorption characteristics.

Figure 4B:
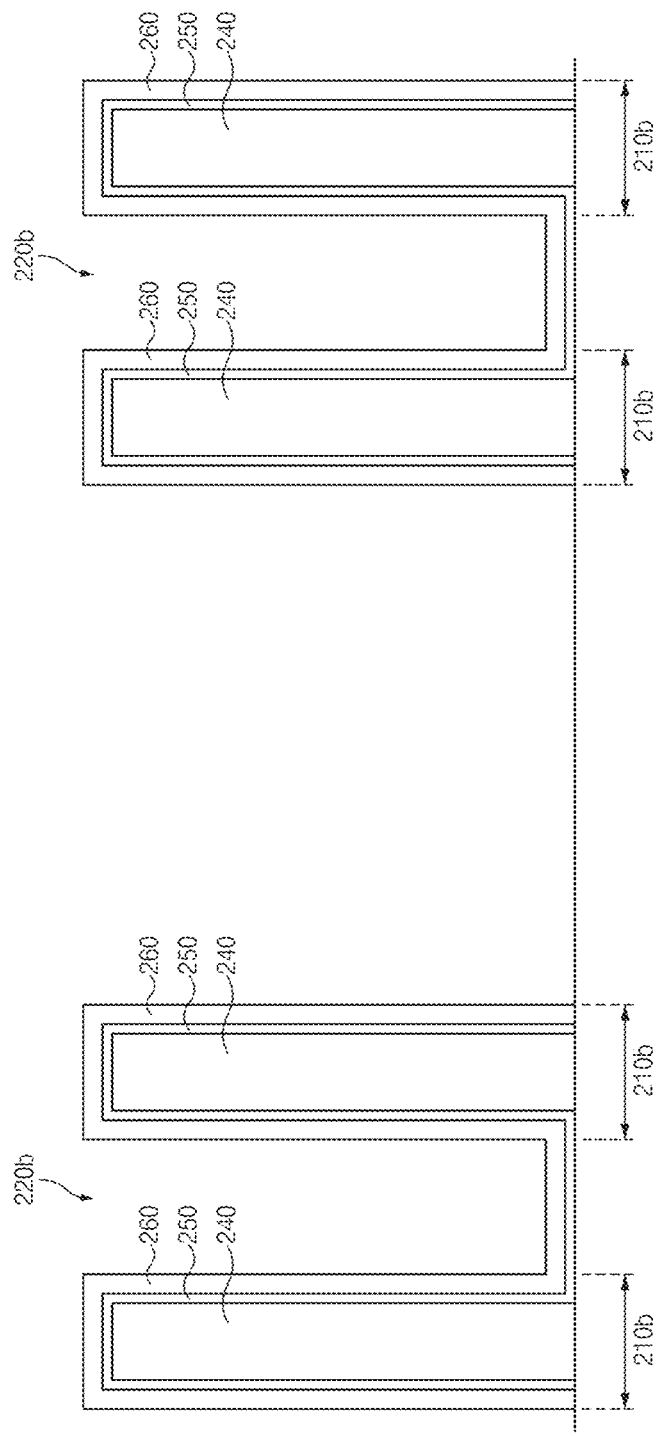
FIG. 4B is a cross-sectional view illustrating another example of the pixel array taken along the second cutting line shown in FIG. 2 based on some embodiments of the disclosed technology.

FIG. 4B is a cross-sectional view illustrating another example of the pixel array taken along the second cutting line B-B' shown in FIG. 2 based on some embodiments of the disclosed technology.

Referring to FIG. 0.4B, at least one air grid 210b and at least one hole 220b are shown in the cross-sectional view taken along the second cutting line B-B'.

The air grid 210b shown in FIG. 4B is identical or similar in structure to the air grid shown in FIG. 4A except for the hole 220a arranged at a region corresponding to the center of the air layers 240 of the air grids 210b contiguous to each other. A first capping film 250 and a second capping film 260 may be sequentially arranged in a lower portion of the hole 220b. In some implementations, the first capping film 250 and the second capping film 260 that are arranged in the lower portion of the hole 220b may be respectively integrated with the first capping film 250 and the second capping film 260 of each of the air grids 210b surrounding the hole 220b.

In some implementations, the hole 220b may be formed in a manner that the air layer 240 is omitted from the air grid 210b, and the first capping film 250 and the second capping film 260 are sequentially stacked while being in contact with the substrate (or an anti-reflection layer disposed over the substrate), resulting in formation of the hole 220b.

Unlike the structure shown in FIG. 4B, it is assumed that the same structure as the air grid 210b is arranged in a region corresponding to the hole 220b such that the air layers 240 of the entire pixel array 110 are interconnected through a single region, forming a mesh-type structure.

In one example, since each of the first capping film 250 and the second capping film 260 is formed as a thin film, a vulnerable portion of the first and second capping films 250 and 260 that may exist due to limitations in fabrication processes and certain environments such as a high-temperature condition may cause collapse of the first and second capping films 250 and 260 when pressure is applied to the vulnerable portion. Such pressure applied to the vulnerable portion may increase in proportion to temperature and the volume of internal air of the air layer 240. As described above, in the case of using the mesh-type structure in which the air layers 240 of the entire pixel array 110 are interconnected through a single region, pressure corresponding to volume of the air layers 240 of the entire pixel array 110 is applied to the vulnerable portion, causing collapse of the pixel array.

However, the grid structure based on some embodiments may include a plurality of holes 220b, each of which is arranged in each crossing point of the first air grid 210b extending in the row direction of the grid structure and the second air grid 210b extending in the column direction of the grid structure. Therefore, the air layers 240 of the air grids 210a that are respectively located at an upper part, a lower part, a left part, and a right part with respect to the position of each hole 220b can almost be physically isolated from one another. As a result, instead of applying pressure corresponding to volume of the air layers 240 of the entire pixel array 110 to the vulnerable point another pressure corresponding to volume of only one air layer 240 of the air grid 210b formed to extend along one side of the unit pixel may be applied to the vulnerable point in a manner that pressure to be applied to the vulnerable point can be dispersed and collapse (or popping) of the structure at the vulnerable point can be effectively prevented. That is, the pressure applied to a particular vulnerable point can be significantly reduced compared to the case of using the mesh-type structure in which the air layers 240 of the entire pixel array 110 are connected.

FIGS. 5A to 5G are cross-sectional views illustrating processes for forming the grid structure based on some embodiments of the disclosed technology.

Referring to FIGS. 5A to 5G, a method for forming the air grid 210a including the metal layer 230 shown in FIGS. 3A and 3B, and the hole 220a including the metal layer 230 shown in FIGS. 3A and 3B is as follows. Except for the fabrication process for forming the metal layer 230 of the air grid 210a shown in FIG. 4A, methods for forming the air grid 210b and the hole 220b (shown in FIGS. 4A and 4B), each of which does not include the metal layer 230 shown in FIGS. 4A and 4B, may be similar or identical to each other.

In addition, the cross-sectional views shown in FIGS. 5A to 5G may respectively correspond to cross-sectional views taken along the second cutting line B-B' shown in FIG. 2.

Figure 5A:
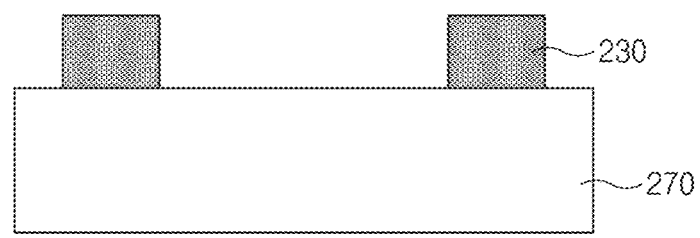
FIGS. 5A to 5G are cross-sectional views illustrating processes for forming a grid structure based on some embodiments of the disclosed technology.

In step S10 shown in FIG. 5A, the metal layer 230 may be deposited over a substrate 270, forming the metal layer 230. The height of the metal layer 230 may correspond to the height of the metal layer 230 of the air grid 210a. For example, the substrate 270 may be a P-type or N-type bulk substrate, may be a P-type bulk substrate in which a P-type or N-type epitaxial layer is grown, or may be an N-type bulk substrate in which a P-type or N-type epitaxial layer is grown.

After the metal layer 230 is formed, a first mask pattern (not shown) defining both the air grid 210a and the hole 220a may be disposed over the metal layer 230. The metal layer 230 may be etched using the first mask pattern (not shown) as an etch mask, and the metal layer 230 corresponding to the air grid 210a and the hole 220a may be formed. In this case, the etch height of the metal layer 230 may be pre-determined by the height of the metal layer 230 contained in the air grid 210a. The first mask pattern (not shown) and each of the following mask patterns may include a photoresist pattern.

After etching of the metal layer 230 is completed, the first mask pattern may be removed.

Figure 5B:
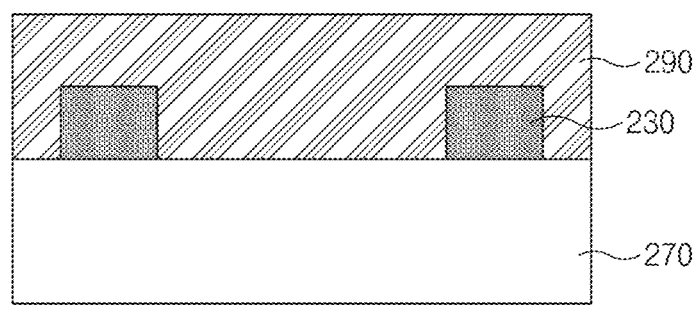

In step S20 shown in FIG. 5B, a sacrificial film 290 may be formed over the entirety of the metal layer 230 and the substrate 270. The sacrificial film 290 may include a carbon-containing spin-on carbon (SOC) film. However, the height of the sacrificial film 290 may be similar or identical to the height of the air grid 210a. To this end, an additional process for making the heights of the sacrificial film 290 and the air grid 210a identical may be carried out.

Figure 5C:
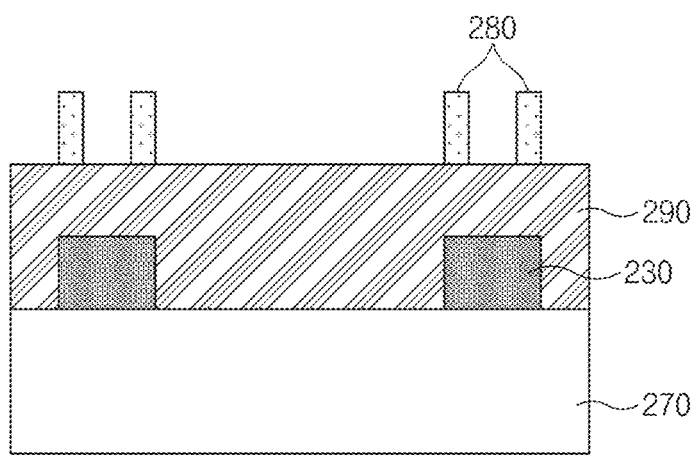

In step S30 shown in FIG. 5C, a second mask pattern 280 formed to define the air grid 210a may be disposed over the sacrificial film 290.

Figure 5D:
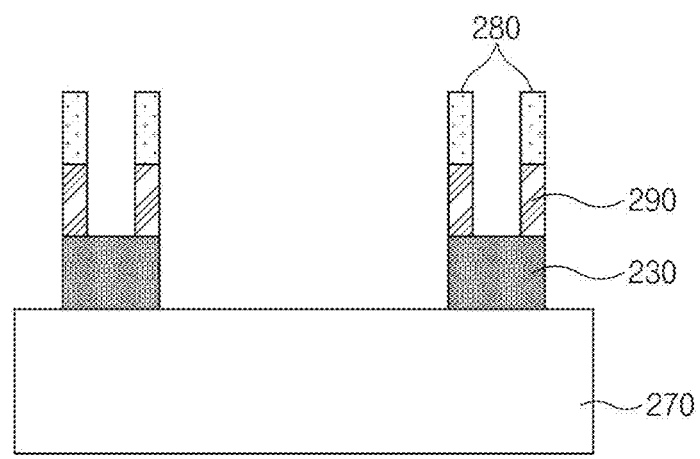

In step S40 shown in FIG. 5D, the sacrificial film 290 may be etched using the second mask pattern 280 as an etch mask, such that the sacrificial film 290 is etched in the region (e.g., the unit pixel region and the hole) other than the air grid 210a. In one example, the etch depth in the region corresponding to the unit pixel (e.g., P5) may be deeper than the etch depth in the region corresponding to the hole 220a such that the metal layer 230 can be arranged in the lower portion of the hole 220a in the same manner as in the air grid 210a. To this end, etch energy generated in the region corresponding to the unit pixel (e.g., P5) may be greater than etch energy generated in the region corresponding to the hole 220a.

In another embodiment, the etch depth in the region corresponding to the unit pixel (e.g., P5) may be identical to the etch depth in the region corresponding to the hole 220a. In this case, the metal layer 230 may not be arranged in the lower portion of the hole 220a.

Thereafter, the second mask pattern 280 may be removed. After completion of step S40, formation of the sacrificial film 290 corresponding to the shape of the air layer 240 contained in the air grid 210a may be completed.

Figure 5E:
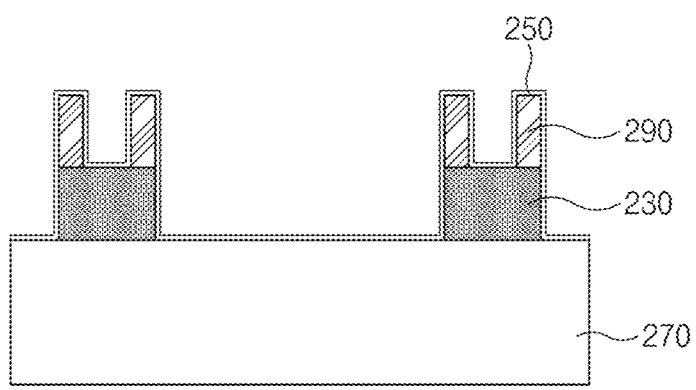

In step S50 shown in FIG. 5E, the first capping film 250 may be deposited over the substrate 270, the sacrificial film 290, and the metal layer 230, forming the first capping film 250. The first capping film 250 may include an oxide film such as a ULTO film. In some implementations, the first capping film 250 may be formed to a predetermined thickness through which molecules formed by combining gas to be used in a subsequent plasma process with carbon of the sacrificial film pattern 290 can be easily discharged outside. In some implementations, the first capping film 250 may be formed to a thickness of 300 Å or less.

Figure 5F:
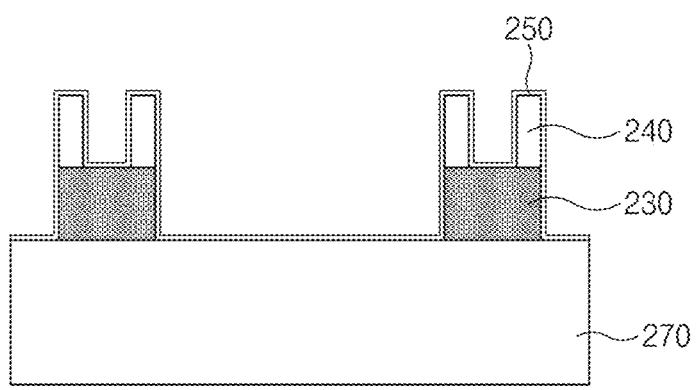

In step S60 shown in FIG. 5F, after formation of the first capping film 250, the plasma process may be carried out upon the resultant structure, such that the sacrificial film pattern 290 may be removed and the air layer 240 may be formed at the position from which the sacrificial film 290 is removed. In this case, the plasma process may be carried out using gas (e.g., $O_2$, $N_2$, $H_2$, CO, $CO_2$, or $CH_4$) including at least one of oxygen, nitrogen, and hydrogen. In this case, the above-mentioned processes will hereinafter be described using the $O_2$ plasma process as an example. If the $O_2$ plasma process is carried out upon the resultant structure, oxygen radicals (O*) may flow into the sacrificial film 290 through the first capping film 250, and the oxygen radicals (O*) included in the sacrificial film 290 may be combined with carbons of the sacrificial film 290, resulting in formation of CO or $CO_2$). The formed CO or $CO_2$ may be discharged outside through the first capping film 250. As a result, the sacrificial film 290 may be removed, and the air layer 240 may be formed at the position from which the sacrificial film 290 is removed.

In some embodiments of the disclosed technology, in order to prevent collapse (or popping) of the first capping film 250 in a situation in which the sacrificial film 290 is removed, the plasma process may be carried out in a situation in which a support film (not shown) such as an oxide film is formed over the sacrificial film 290.

Figure 5G:
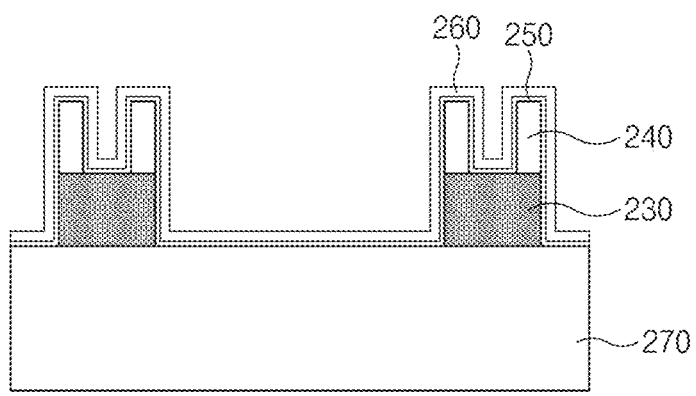

In step S70 shown in FIG. 5G, after completion of the plasma process, the second capping film 260 may be deposited over the first capping film 250. For example, the second capping film 260 may be formed of an insulation film that includes at least one of a silicon oxide nitride film ($Si_xO_yN_z$, where each of 'x', 'y', and 'z' is a natural number), a silicon oxide film ($Si_xO_y$, where each of 'x' and 'y' is a natural number), and a silicon nitride film ($Si_xN_y$, where each of 'x' and 'y' is a natural number). The second capping film 260 may have a larger thickness than the first capping film 250. The second capping film 260 may be formed to a predetermined thickness through which the shape of the air grid 210a can be stably maintained.

In addition, although FIGS. 5A to 5G illustrate the first capping film 250 and the second capping film 260 as being stacked over the substrate 270, it should be noted that a first capping film 250 and a second capping film 260 disposed over the substrate 270 are omitted from the structures shown in FIGS. 3A and 4A for convenience of description and better understanding of the disclosed technology.

It is understood that various embodiments and terminology used herein are not intended to limit technical ideas described in this document to specific embodiments, but rather to include various modifications, equivalents, and/or alternatives of the embodiments. Wherever possible, the same reference numbers will be used throughout the drawings to refer to the same or like portions. As used in the specification and appended claims, the terms "a", "an", "one", "the" and other similar terms include both singular and plural forms, unless context clearly dictates otherwise. A singular representation may include a plural representation unless otherwise stated in context. In the present application, an expression such as "A or B", "at least one of A and B", "at least one of A or B", "A, B or C", "at least one of A, B and C", or "at least one of A, B, or C" may include all possible combinations of one or more items selected from among listed related items. An expression such as "first" and "second" used in the present application may indicate corresponding constituent elements regardless of order and/or importance, is used to distinguish a constituent element from another constituent element, and does not limit corresponding constituent elements. When it is described that a constituent element (e.g., a first constituent element) is "(functionally or communicatively) coupled to" or is "connected to" another constituent element (e.g., a second constituent element), it should be understood that the constituent element may be directly (e.g., by wire) connected to the other constituent element, may be wirelessly connected to the other constituent element, or may be connected to the other constituent element through another constituent element (e.g., a third constituent element).

In accordance with various embodiments, each (e.g., a module or program) of the above-mentioned constituent elements may include one or more entities. In accordance with various embodiments, at least one constituent element from among the above-mentioned constituent elements or at least one operation may be omitted, or one or more other constituent elements or one or more other operations may be added. Alternatively or additionally, the plurality of constituent elements (e.g., modules or programs) may be integrated into only one constituent element. In this case, the integrated constituent element may perform one or more functions of each of the plurality of constituent elements in the same way as or in a similar way to the previous operation that has been executed by the corresponding constituent element from among the plurality of constituent elements prior to execution of such integration. According to various embodiments, operations performed by a module, a program, or another constituent element may be sequentially, parallelly, repeatedly, or heuristically executed, at least one of the above operations may be executed in different order or omitted, or another operation may be added.

As is apparent from the above description, the image sensor according to the embodiments of the disclosed technology may distribute pressure applied to a vulnerable point of the air grid, such that the image sensor can effectively prevent collapse (or popping) of the air grid at the vulnerable point of the air grid.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein without departing from the spirit and essential characteristics of the disclosed technology. The above embodiments are therefore to be construed in all aspects as illustrative and not restrictive. The scope of the disclosed technology should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosed technology or included as a new claim by a subsequent amendment after the application is filed.

Although a number of illustrative embodiments consistent with the disclosed technology have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensor comprising:
   a grid structure extending in rows and columns of a pixel array including a plurality of imaging pixels arranged in rows and columns and structured to separate the imaging pixels from one another, the grid structure structured to include an air layer filled with air to provide optical isolation between two adjacent imaging pixels; and
   a plurality of holes respectively formed at crossing points of the grid structure, wherein each of the plurality of holes does not include the air layer.

2. The image sensor according to claim 1, further comprising:
   a color filter arranged between neighboring grid structures disposed along boundaries between neighboring unit pixels in the pixel array.

3. The image sensor according to claim 1, wherein each hole is formed by forming the grid structure except for center portions of the crossing points of the grid structure.

4. The image sensor according to claim 1, wherein each hole is arranged at a center of a (2×2) matrix of unit pixels.

5. The image sensor according to claim 1, wherein each hole is formed in a circular shape.

6. The image sensor according to claim 1, wherein the grid structure further includes
   a first capping film formed to surround the air layer.

7. The image sensor according to claim 6, wherein:
   a refractive index of the first capping film is higher than a refractive index of the air layer, and is lower than a refractive index of a color filter contacting the grid structure.

8. The image sensor according to claim 6, wherein the grid structure further includes:
   a second capping film formed to surround the first capping film, and formed to have a larger thickness than the first capping film.

9. The image sensor according to claim 6, wherein the grid structure further includes:
   a metal layer arranged below the air layer.

10. The image sensor according to claim 1, wherein:
    a lower portion of the hole includes a stacked structure of a first capping film and a second capping film that are respectively integrated with a first capping film of the grid structure surrounding the hole and a second capping film of the grid structure surrounding the hole.

11. The image sensor according to claim 10, further comprising:
    a metal layer interposed between the first capping film of the lower portion of the hole and a substrate.

12. The image sensor according to claim 11, wherein the metal layer includes tungsten (W).

13. An image sensor comprising:
    a plurality of (2×2) matrix arrays of unit pixels;
    a plurality of holes arranged at centers of the plurality of (2×2) matrix arrays of unit pixels, respectively; and
    a grid structure extending in a direction from the plurality of holes, respectively, along one side of each of the unit pixels,
    wherein the grid structure includes an air layer filled with air, and
    wherein each of the plurality of holes does not include the air layer.

14. The image sensor according to claim 13, wherein the grid structure is formed to surround the hole.

15. The image sensor according to claim 13, wherein the hole is formed by forming the grid structure except for a location where the hole is formed.

16. The image sensor according to claim 13, wherein the hole is formed in a circular shape.

17. The image sensor according to claim 13, wherein the grid structure further includes
    a first capping film formed to surround the air layer.

18. The image sensor according to claim 17, wherein the grid structure further includes:
    a metal layer arranged below the air layer.

19. The image sensor according to claim 13, wherein:
    a lower portion of the hole includes a stacked structure of a first capping film and a second capping film that are respectively integrated with a first capping film of the grid structure surrounding the hole and a second capping film of the grid structure surrounding the hole.

20. The image sensor according to claim 19, further comprising:
    a metal layer interposed between the first capping film of the lower portion of the hole and a substrate.

21. An image sensor comprising:
    a grid structure extending in rows and columns of a pixel array including a plurality of imaging pixels arranged in rows and columns and structured to separate the imaging pixels from one another, the grid structure structured to include a low-index material or an air layer filled with air to provide optical isolation between two adjacent imaging pixels; and a plurality of holes respectively formed at crossing points of the grid structure, wherein each of the plurality of holes includes none of the low-index material and the air layer.

\* \* \* \* \*